US011056425B2

(12) United States Patent
Edelstein et al.

(10) Patent No.: US 11,056,425 B2
(45) Date of Patent: Jul. 6, 2021

(54) STRUCTURAL ENHANCEMENT OF CU NANOWIRES

(71) Applicant: INTERNATIONAL BUSINESS MACHINES CORPORATION, Armonk, NY (US)

(72) Inventors: Daniel C. Edelstein, White Plains, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/238,214

(22) Filed: Jan. 2, 2019

(65) Prior Publication Data

US 2019/0157202 A1    May 23, 2019

Related U.S. Application Data

(62) Division of application No. 14/968,570, filed on Dec. 14, 2015, now Pat. No. 10,211,148.

(51) Int. Cl.
*H01L 23/532* (2006.01)
*H01L 23/522* (2006.01)
*H01L 21/768* (2006.01)

(52) U.S. Cl.
CPC .... *H01L 23/5226* (2013.01); *H01L 21/76831* (2013.01); *H01L 21/76897* (2013.01); *H01L 23/53238* (2013.01); *H01L 21/76814* (2013.01); *H01L 21/76826* (2013.01); *H01L 21/76834* (2013.01); *H01L 21/76883* (2013.01); *H01L 23/53295* (2013.01)

(58) Field of Classification Search
CPC ........... H01L 23/5226; H01L 23/53238; H01L 23/53239; H01L 21/76831; H01L 21/76897; H01L 21/76814; H01L 21/76826; H01L 21/76834; H01L 21/76883
See application file for complete search history.

(56) References Cited

U.S. PATENT DOCUMENTS

| 5,891,513 | A  | 4/1999 | Dubin et al. |
| 6,706,625 | B1 | 3/2004 | Sudijono et al. |
| 7,514,361 | B2 | 4/2009 | Bonilla et al. |
| 7,727,888 | B2 | 6/2010 | Yang et al. |

(Continued)

OTHER PUBLICATIONS

Anonymous, "Bi-directionally self-aligned vias", IPCOM000231097D, Sep. 16, 2013, pp. 1-6, Ip.com, United States.

(Continued)

*Primary Examiner* — Timor Karimy
(74) *Attorney, Agent, or Firm* — Sherman IP LLP; Kenneth L. Sherman; Steven Laut

(57) ABSTRACT

A structure comprising a first dielectric layer embedded with a first interconnect structure. An insulator layer is disposed on the first dielectric layer. A second dielectric layer is disposed on the insulator layer. A via resides within the second dielectric layer. A second interconnect structure is isolated from the first dielectric layer. A first portion of a bottom surface of the via resides on a top surface of the insulator layer. A second portion of the bottom surface of the via resides on a first portion of a top surface of the first interconnect structure.

14 Claims, 6 Drawing Sheets

(56) References Cited

U.S. PATENT DOCUMENTS

| | | | |
|---|---|---|---|
| 7,834,457 B2 * | 11/2010 | Yang | ................ H01L 21/76805 |
| | | | 257/751 |
| 7,964,966 B2 * | 6/2011 | Yang | ................ H01L 23/53238 |
| | | | 257/751 |
| 8,138,604 B2 | 3/2012 | Yang et al. | |
| 8,232,645 B2 | 7/2012 | Yang et al. | |
| 8,361,900 B2 | 1/2013 | Pan et al. | |
| 8,664,766 B2 | 3/2014 | Yang et al. | |
| 2004/0058547 A1 | 3/2004 | Morrow et al. | |
| 2005/0003660 A1 | 1/2005 | Murakawa et al. | |
| 2006/0175708 A1 | 8/2006 | Ueno | |
| 2012/0068344 A1 | 3/2012 | Bonilla et al. | |
| 2012/0181694 A1 | 7/2012 | Usami et al. | |
| 2014/0162450 A1 * | 6/2014 | Yang | ................... H01L 21/7684 |
| | | | 438/626 |
| 2015/0357236 A1 | 12/2015 | Edelstein et al. | |

OTHER PUBLICATIONS

List of IBM Patents or Patent Applications Treated as Related Form; Edelstein, D. et al., U.S. Appl. No. 14/968,570, filed Dec. 14, 2015

* cited by examiner

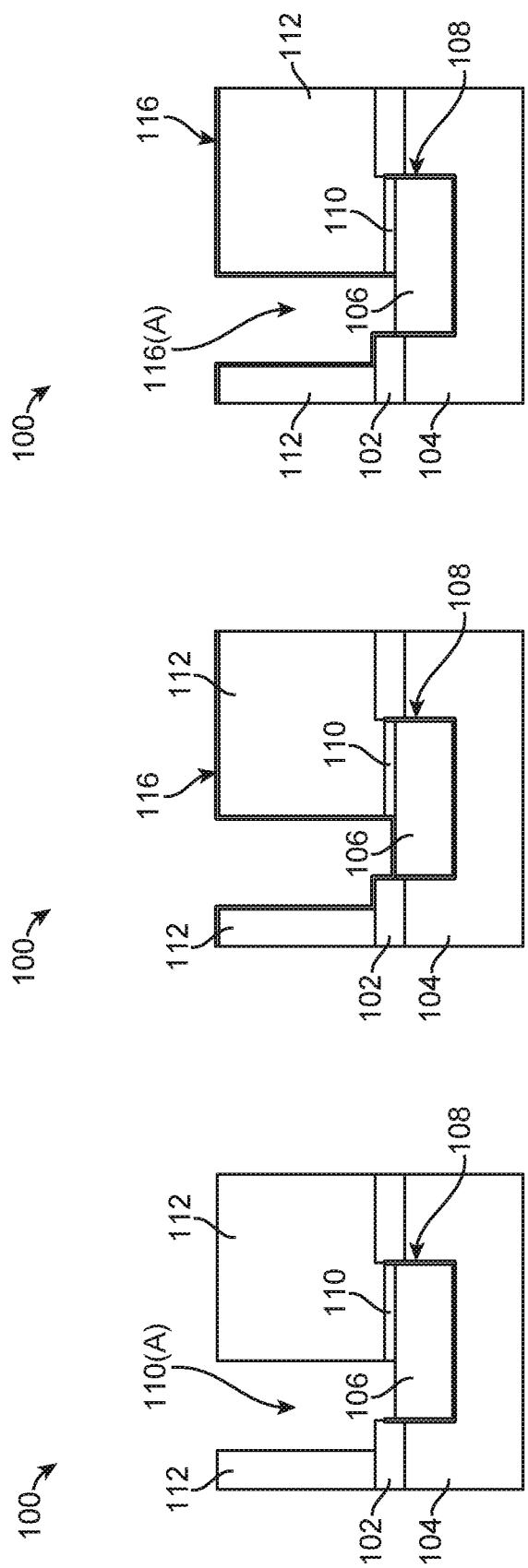

STRUCTURAL ENHANCEMENT OF CU NANOWIRES

BACKGROUND

Generally, semiconductor devices include multiple circuits that form an integrated circuit fabricated on a semiconductor substrate. A complex network of signal paths will normally connect the circuit elements distributed on the surface of the substrate. Efficient routing of these signals across the device requires formation of multilevel or multilayered schemes, such as single or dual damascene wiring structures. The wiring structure typically includes copper (Cu) given Cu based interconnects provide higher speed signal transmission between large numbers of transistors on a complex semiconductor chip as compared with aluminum-based interconnects. Within a typical dual damascene interconnect structure, metal vias run perpendicular to the semiconductor substrate and metal lines run parallel to the semiconductor substrate. Typically, the metal vias are present beneath the metal lines and both features are embedded within a dielectric material.

SUMMARY

Embodiments relate to semiconductor structures, in particular, forming interconnect structures isolated from a dielectric substrate. In one embodiment, a semiconductor structure includes a first dielectric layer embedded with a first interconnect structure. An insulator layer is disposed on the first dielectric layer. A second dielectric layer is disposed on the insulator layer. A via resides within the second dielectric layer. A second interconnect structure is isolated from the first dielectric layer. A first portion of a bottom surface of the via resides on a top surface of the insulator layer. A second portion of the bottom surface of the via resides on a first portion of a top surface of the first interconnect structure.

These and other features, aspects and advantages of the embodiments will become understood with reference to the following description, appended claims and accompanying figures.

BRIEF DESCRIPTION OF THE DRAWINGS

FIG. 6 is a cross-sectional view of the result of the exemplary semiconductor structure of FIG. 5 after selectively removing a first portion of the capping layer and exposing a portion of the top surface of the interconnect structure, according to an embodiment;

FIG. 7A is a cross-sectional view of the result of the exemplary semiconductor structure of FIG. 6 after nitridizing the semiconductor structure, according to an embodiment;

FIG. 7B is a cross-sectional view of the result of the exemplary semiconductor structure of FIG. 7A after selectively removing a portion of the nitridized layer to expose the top surface of the first interconnect structure, according to an embodiment;

DETAILED DESCRIPTION

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As used herein, a "lengthwise" element is an element that extends along a corresponding lengthwise direction, and a "widthwise" element is an element that extends along a corresponding widthwise direction.

Figure 1:
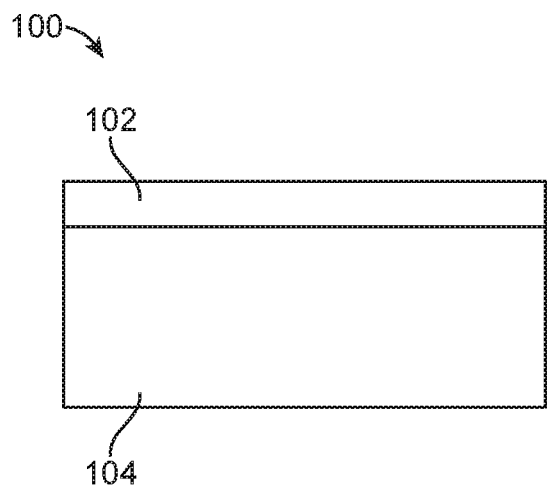
FIG. 1 is a cross-sectional view of an exemplary semiconductor structure with an insulator layer formed on a first dielectric layer, according to one embodiment.
Figure 2:
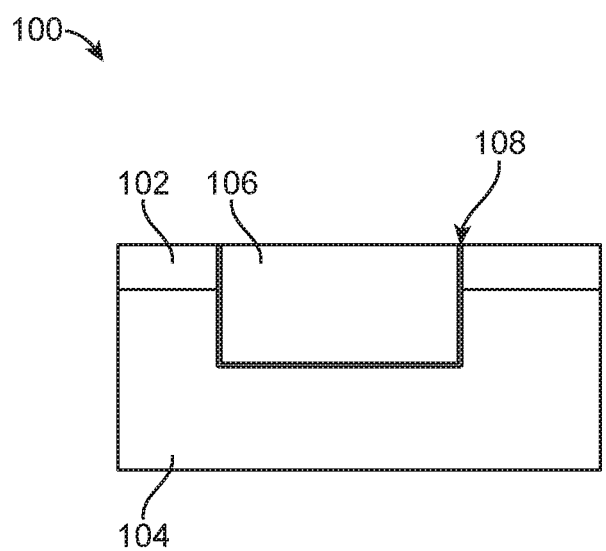
FIG. 2 is a cross-sectional view of a result of the exemplary semiconductor structure of FIG. 1 after embedding a first interconnect structure within the first dielectric layer, according to an embodiment.

FIG. 1 is a cross-sectional view of an exemplary semiconductor structure 100 with an insulator layer 102 formed on a first dielectric layer 104, according to one embodiment. FIG. 2 is a cross-sectional view of a result of the exemplary semiconductor structure 100 of FIG. 1 after embedding a first interconnect structure 106 within the insulator layer 102 and the first dielectric layer 104, according to an embodiment. In this embodiment, embedding the first interconnect structure comprises; forming a first recess through the insulator layer 102 and into a top surface of the first dielectric layer 104. Then, forming a diffusion barrier layer 108 in the first recess configured to isolate the first interconnect structure 106 from the first dielectric layer 104 and the insulator layer 102. In one embodiment, the diffusion barrier layer 108 comprises of tantalum. In another embodiment, the diffusion barrier layer 108 comprises tungsten. In another embodiment, the diffusion barrier layer 108 comprises cobalt. It is understood that various nitride materials may be employed as the diffusion barrier layer 108. In one embodiment, insulator layer 102 abuts the diffusion barrier layer 108.

Moreover, the diffusion barrier layer 108 is configured to isolate the first interconnect structure 106 from the first dielectric layer 104 and the insulator layer 102. After formation of the diffusion barrier layer 108, the first interconnect structure 106 is formed within the first recess. In one embodiment, the first recess is formed using a chemical mechanical polishing/planarization (CMP) process.

Figure 3:
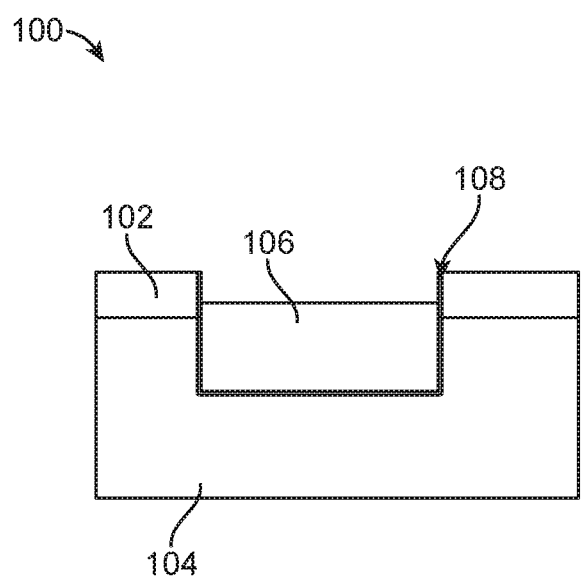
FIG. 3 is a cross-sectional view of a result of the exemplary semiconductor structure of FIG. 2 after forming a recess in a top surface of the first interconnect structure, according to an embodiment.

FIG. 3 is a cross-sectional view of a result of the exemplary semiconductor structure 100 of FIG. 2 after forming a recess in a top surface of the first interconnect structure 106, according to an embodiment. In one embodiment, the second recess is formed in the interconnect structure 106 using a chemical mechanical polishing/planarization (CMP) process or wet etching or combination of the same. In this embodiment, the top surface of the interconnect structure 106 is below a top surface of the insulator layer 102. In this embodiment, the second recess is formed only in the interconnect structure 106; the diffusion barrier layer 108 is left unmodified.

Figure 4:
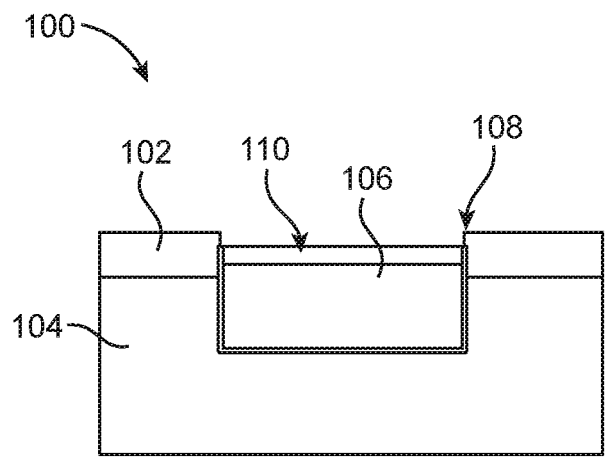
FIG. 4 is a cross-sectional view of the result of the exemplary semiconductor structure of FIG. 3 after forming a capping layer on the top surface of the first interconnect structure, according to an embodiment.

FIG. 4 is a cross-sectional view of the result of the exemplary semiconductor structure 100 of FIG. 3 after forming a capping layer on the top surface of the first interconnect structure 106, according to an embodiment. In one embodiment, the capping layer 110 is formed on the top surface of the interconnect structure 106. In this embodiment, the top surface of the capping layer 110 is below the top surface of the insulator layer 102. In another embodiment, the top surface of the capping layer 110 may be coplanar with the top surface of the insulator layer 102.

Figure 5:
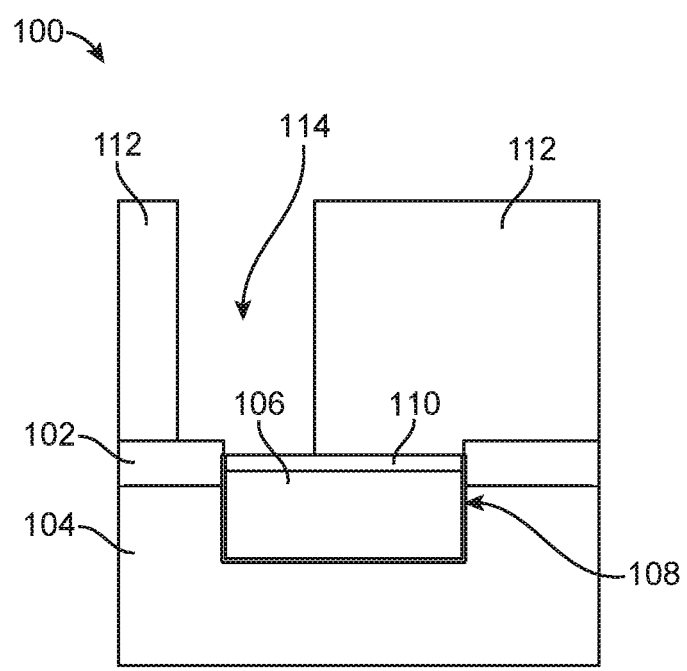
FIG. 5 is a cross-sectional view of the result of the exemplary semiconductor structure of FIG. 4 after forming a second dielectric layer and forming a partially-landed via, according to an embodiment.

FIG. 5 is a cross-sectional view of the result of the exemplary semiconductor structure 100 of FIG. 4 after forming a second dielectric layer 112 and forming a partially-landed via 114, according to an embodiment. In this embodiment, the second dielectric layer 112 is applied to the entire structure 100, particularly, on the top surface of the insulator layer 102 and the top surface of the capping layer 110. Formation of the via (partially-landed or otherwise) is performed by etching (e.g., wet etching, dry etching, etc.) In one embodiment, a first portion of a bottom surface of the via 114 resides on a top surface of the insulator layer 102. A second portion of the bottom surface of the via 114 resides on a first portion of the top surface of the capping layer 110.

FIG. 6 is a cross-sectional view of the result of the exemplary semiconductor structure 100 of FIG. 5 after selectively removing a first portion of the capping layer 110(A) and exposing a portion of the top surface of the interconnect structure 106, according to an embodiment. In one embodiment, the first portion of the capping layer 110(A) is removed by etching (e.g., wet etching, dry etching, reactive-ion etching, etc.). In this embodiment, a portion of the top surface of the interconnect structure 106 is exposed.

FIG. 7A is a cross-sectional view of the result of the exemplary semiconductor structure 100 of FIG. 6 after nitridizing the semiconductor structure 100, according to an embodiment. In this embodiment, the semiconductor structure 100 is directly exposed to a nitrogen or ammonia plasma and all exposed surfaces of the semiconductor structure 100 are nitridized. In another embodiment, only surfaces of the second dielectric layer 112, the exposed portion of the interconnect structure 106 and a portion of the exposed insulator layer 102 are nitridized. FIG. 7B is a cross-sectional view of the result of the exemplary semiconductor structure 100 of FIG. 7A after selectively removing a portion of the nitridized layer 116 to expose the top surface of the first interconnect structure 106, according to an embodiment. In one embodiment, the partially removed nitridized layer 116(A) is removed by a remote plasma treatment.

Figure 8:
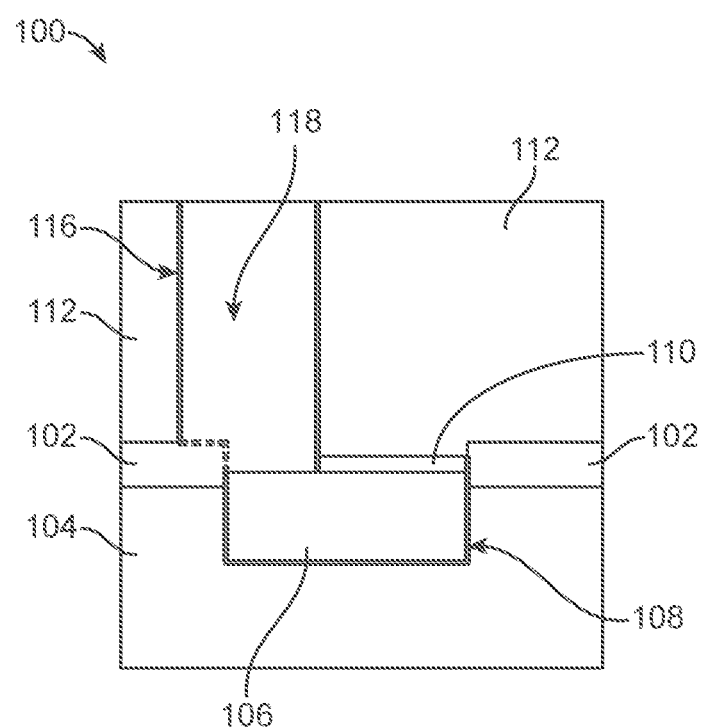
FIG. 8 is a cross-sectional view of the result of the exemplary semiconductor structure of FIG. 7B after forming a second interconnect structure, according to an embodiment.

FIG. 8 is a cross-sectional view of the result of the exemplary semiconductor structure 100 of FIG. 7B after forming a second interconnect structure 118, according to an embodiment. In one embodiment, the second interconnect structure 118 is a Cu nanowire. In this embodiment, the second Cu interconnect structure 118 is embedded into the first interconnect structure 106. In this embodiment, the second interconnect structure 118 is also isolated from the first dielectric layer 104 by the nitridized layer 116, the capping layer 110 and the insulator layer 102.

Figure 9:
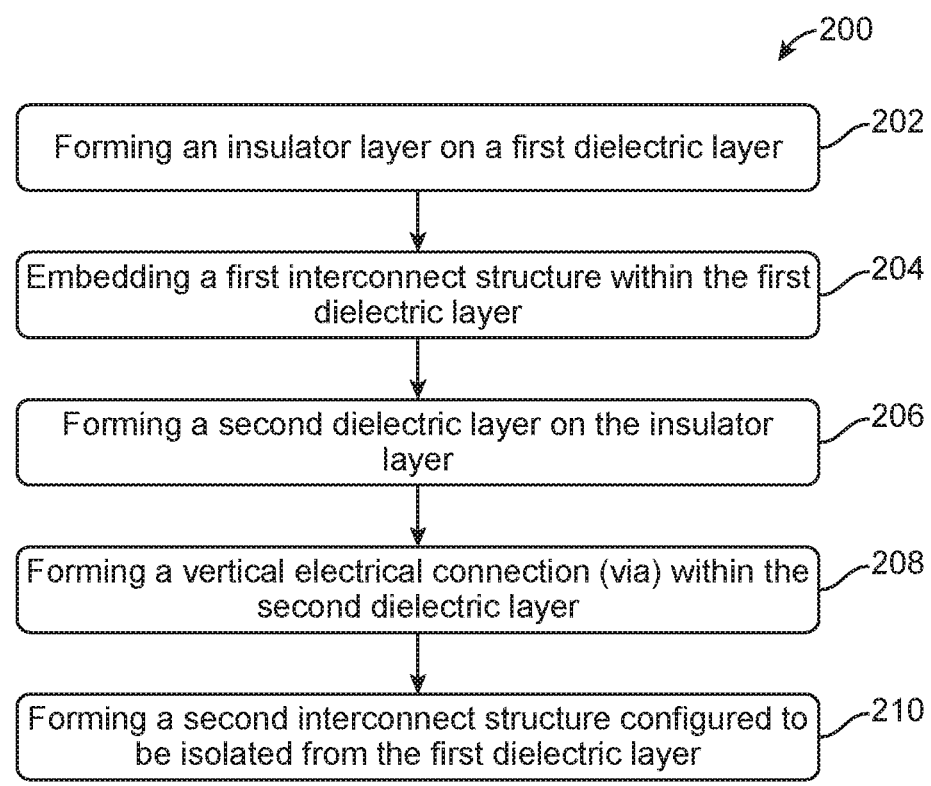
FIG. 9 illustrates a block diagram for a process for forming interconnect structures isolated from a dielectric substrate, according to one embodiment.

FIG. 9 illustrates a block diagram for a process 200 for forming interconnect structures isolated from a dielectric substrate, according to one embodiment. In one embodiment, the method 200 begins with block 202 which is forming an insulator layer 102 on a first dielectric layer 104 (FIG. 8). After block 202, the method 200 continues with block 204, embedding a first interconnect structure 106 within the insulator layer 102 and the first dielectric layer 104 (FIG. 8). In one embodiment, embedding the first interconnect structure comprises 106 forming a first recess through the insulator layer and into a top surface of the first dielectric layer; forming a capping layer 110 (FIG. 8) in the first recess configured to isolate the first interconnect structure 106 from the first dielectric layer 104 and the insulator layer 102 (FIG. 8); and forming the first interconnect structure 106 within the first recess. In one embodiment, the step at block 204 further comprises forming a second recess in a top surface of the first interconnect structure 106; and forming a capping layer 110 on the top surface of the first interconnect structure 106 (FIG. 8).

After completion of block 204, the method 200 proceeds to block 206, forming a second dielectric layer 112 on the insulator layer 102 and the capping layer 110. After completion of block 206, the method 200 continues with block 208, forming a vertical electrical connection (via) 114 within the second dielectric layer 112. In one embodiment, a first portion of a bottom surface of the via 114 resides on a top surface of the insulator layer 102 and a second portion of the bottom surface of the via 114 resides on a first portion of a top surface of the capping layer 110. In one embodiment, step 208 further comprises removing the first portion of the capping layer 110 to expose a portion of the first interconnect layer 106, and then applying a nitridized layer 116 to surfaces in the via 114.

In one embodiment, application of the nitridized layer 116 is performed by directly exposing the whole structure to a nitrogen or ammonia plasma and all exposed surfaces of the structure 100 are nitridized. In another embodiment, only surfaces of the second dielectric layer 112, the exposed portion of the first interconnect structure 106 and a portion of the exposed insulator layer 102 are nitridized (FIG. 7A).

Finally, after block 208 the method 200 continues with block 210, forming a second interconnect structure 118 configured to be isolated from the first dielectric layer 104. In one embodiment, forming a second interconnect structure comprises removing a portion of the nitridized layer 116(A) residing on the top surface of the first interconnect structure 106; and forming the second interconnect structure 118 in the via 114. In one embodiment, the second interconnect structure 118 is embedded in the insulator layer 102 and the first interconnect structure 106. Moreover, in this embodiment, the second Cu interconnect structure 118 is isolated from the first dielectric layer 104 by the nitridized layer 116, the capping layer 110 and the insulator layer 102 (FIG. 8).

The exemplary methods and techniques described herein may be used in the fabrication of IC chips. In one embodiment, the IC chips may be distributed by a fabricator in raw wafer form (i.e., as a single wafer that has multiple unpackaged IC chips), as a bare die, or in a packaged form. In the latter case, the IC chip is mounted in a single IC chip package (e.g., a plastic carrier with leads that are affixed to a motherboard or other higher level carrier) or in a multi-IC chip package (e.g., a ceramic carrier that has either or both surface interconnections or buried interconnections). The IC chip is then integrated with other IC chips, discrete circuit elements and/or other signal processing devices as part of either (a) an intermediate product, such as a motherboard, or (b) an end product, such as microprocessors, smart phones, mobile phones, cellular handsets, set-top boxes, DVD recorders and players, automotive navigation, printers and peripherals, networking and telecom equipment, gaming systems, toys and digital cameras, as non-limiting examples. One or more embodiments, may be applied in any of various highly integrated semiconductor devices.

Unless described otherwise or in addition to that described herein, "depositing" may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, PVD, ALD, chemical oxidation, MBE, plating or evaporation. Any references to "poly" or "poly silicon" should be understood to refer to polycrystalline silicon.

References herein to terms such as "vertical", "horizontal," etc. are made by way of example, and not by way of limitation, to establish a frame of reference. The term "horizontal" as used herein is defined as a plane parallel to the conventional plane or surface of the substrate, regardless of the actual spatial orientation of the semiconductor substrate. The term "vertical" refers to a direction perpendicular to the horizontal, as just defined. Terms, such as "on," "above," "below," "side" (as in "sidewall"), "higher," "lower," "over," "beneath" and "under," are defined with respect to the horizontal plane. It is understood that various other frames of reference may be employed for describing one or more embodiments without departing from the spirit and scope of the one or more embodiments.

References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, materials, and/or components, but do not preclude the presence or addition of one or more other features, steps, operations, elements, materials, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments have been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles of the embodiments and the practical application, and to enable others of ordinary skill in the art to understand the various embodiments with various modifications as are suited to the particular use contemplated.

What is claimed is:

1. A structure, comprising:
   a first dielectric layer embedded with a first interconnect structure;
   a second interconnect structure isolated from the first dielectric layer;
   an insulator layer disposed on the first dielectric layer;
   a second dielectric layer disposed on the insulator layer; and
   a nitridized layer disposed on at least a portion of: a first side surface of the second dielectric layer, a second side surface of the second dielectric layer and a portion of a top surface of the insulator layer;
   wherein the second interconnect structure is embedded into the first interconnect structure and isolated from the first dielectric layer by the nitridized layer, a capping layer and the insulator layer, and a second portion of a bottom surface of the second dielectric layer is embedded in the insulator layer.

2. The structure of claim 1, further comprising a diffusion barrier layer configured to isolate the first interconnect structure from the first dielectric layer and the insulator layer.

3. The structure of claim 2, wherein the insulator layer abuts the diffusion barrier layer.

4. The structure of claim 1, wherein the capping layer resides on a first portion of a top surface of the first interconnect structure and a first portion of the bottom surface of the second dielectric layer.

5. The structure of claim 4, wherein the second interconnect structure resides within the second dielectric layer, and a first portion of the bottom surface of the second interconnect structure resides on a second portion of the top surface of the first interconnect structure.

6. The structure of claim 1, wherein the top surface of the insulator layer is above a top surface of the capping layer, and a second portion of the bottom surface of the second interconnect structure resides on the portion of the top surface of the insulator layer.

7. The structure of claim 1, wherein a portion of the second interconnect structure is misaligned with the first interconnect structure, and the portion of the second interconnect structure is isolated from the first dielectric layer by the insulator layer.

8. A structure, comprising:
   a first dielectric layer embedded with a first interconnect structure that is coupled with a diffusion barrier layer;
   an insulator layer disposed on the first dielectric layer;
   a second dielectric layer disposed on the insulator layer;
   a nitridized layer disposed on at least a portion of: a first side surface of the second dielectric layer, a second side surface of the second dielectric layer and a portion of a top surface of the insulator layer; and
   a second interconnect structure isolated from the first dielectric layer, the second interconnect structure embedded into the first interconnect structure;
   wherein the second interconnect structure is isolated from the first dielectric layer by the nitridized layer, a capping layer and the insulator layer, and a second portion of a bottom surface of the second dielectric layer is embedded in the insulator layer.

9. The structure of claim 8, wherein the diffusion barrier layer is configured to isolate the first interconnect structure from the first dielectric layer and the insulator layer.

10. The structure of claim 9, wherein the insulator layer abuts the diffusion barrier layer.

11. The structure of claim 8, wherein the capping layer resides on a first portion of a top surface of the first interconnect structure and a first portion of the bottom surface of the second dielectric layer.

12. The structure of claim 11, wherein the second interconnect structure resides within the second dielectric layer, and a first portion of the bottom surface of the second interconnect structure resides on a second portion of the top surface of the first interconnect structure.

13. The structure of claim 12, wherein the top surface of the insulator layer is above a top surface of the capping layer, and a second portion of the bottom surface of the second interconnect structure resides on the portion of the top surface of the insulator layer.

14. The structure of claim 8, wherein a portion of the second interconnect structure is misaligned with the first interconnect structure, and the portion of the second interconnect structure is isolated from the first dielectric layer by the insulator layer.

* * * * *